(12) United States Patent
Gu et al.

(10) Patent No.: US 11,437,220 B2
(45) Date of Patent: Sep. 6, 2022

(54) PLASMA PROCESSING APPARATUS AND METHOD OF OPERATING THE SAME

(71) Applicant: SEMES CO., LTD., Cheonan-si (KR)

(72) Inventors: Ja Myung Gu, Cheonan-si (KR); Shant Arakel Yan, Hwaseong-si (KR); Jung Mo Gu, Bucheon-si (KR); Tae Hoon Jo, Seoul (KR)

(73) Assignee: SEMES CO., LTD., Cheonan-si (KR)

( * ) Notice: Subject to any disclaimer, the term of this patent is extended or adjusted under 35 U.S.C. 154(b) by 112 days.

(21) Appl. No.: 16/907,208

(22) Filed: Jun. 20, 2020

(65) Prior Publication Data

US 2020/0411287 A1 Dec. 31, 2020

(30) Foreign Application Priority Data

Jun. 27, 2019 (KR) .......................... 10-2019-0076782

(51) Int. Cl.
*H01J 37/32* (2006.01)

(52) U.S. Cl.
CPC .. *H01J 37/32174* (2013.01); *H01J 37/32009* (2013.01); *H01J 37/32449* (2013.01); *H01J 37/32642* (2013.01); *H01J 37/32522* (2013.01); *H01J 2237/327* (2013.01)

(58) Field of Classification Search
None
See application file for complete search history.

(56) References Cited

U.S. PATENT DOCUMENTS

| | | | | |
|---|---|---|---|---|
| 5,708,556 A * | 1/1998 | van Os | ............... | H01L 21/6831 361/234 |
| 6,363,882 B1 * | 4/2002 | Hao | .................. | H01J 37/32623 118/723 E |
| 6,682,603 B2 * | 1/2004 | Gondhalekar | .... | C23C 16/45563 118/728 |
| 6,741,446 B2 * | 5/2004 | Ennis | ................ | H01J 37/32183 361/234 |
| 6,984,288 B2 * | 1/2006 | Dhindsa | ............ | H01J 37/32522 156/345.47 |
| 7,244,311 B2 * | 7/2007 | Fischer | ............. | H01L 21/67109 257/E21.252 |

(Continued)

FOREIGN PATENT DOCUMENTS

KR 10-2009-0103913 A 10/2009
KR 10-0934402 B1 12/2009

(Continued)

*Primary Examiner* — Srinivas Sathiraju (57) ABSTRACT

A plasma processing apparatus includes a processing chamber providing space for plasma generation, a chuck member provided in the processing chamber and supporting a substrate, at least two RF power sources providing RF power of different frequencies to the chuck member, a ring member provided to surround the chuck member, an edge electrode arranged in the ring member to be electrically insulated from the chuck member, and a variable impedance circuit being electrically connected to the edge electrode. The variable impedance circuit includes an adjustable impedance configured to control a potential of the edge electrode and a high-frequency stop circuit configured to block high-frequency power from being transmitted to the adjustable impedance.

20 Claims, 10 Drawing Sheets

(56) References Cited

U.S. PATENT DOCUMENTS

| | | | |
|---|---|---|---|
| 7,632,375 B2* | 12/2009 | Kuthi | H01J 37/32623 |
| | | | 156/915 |
| 7,777,567 B2 | 8/2010 | Polizzo | |
| 8,308,896 B2* | 11/2012 | Kim | H01J 37/3244 |
| | | | 156/345.43 |
| 8,343,592 B2* | 1/2013 | Kudela | H01L 21/02 |
| | | | 156/345.43 |
| 8,884,520 B2 | 11/2014 | Kim et al. | |
| 9,275,840 B2* | 3/2016 | Glukhoy | H01J 37/32477 |
| 9,484,190 B2* | 11/2016 | Glukhoy | H01J 37/32091 |
| 10,115,564 B2* | 10/2018 | Marakhtanov | H01J 37/32183 |
| 10,510,515 B2* | 12/2019 | Collins | C23C 16/45578 |
| 10,526,708 B2* | 1/2020 | Savas | H01J 37/32568 |
| 10,615,003 B2 | 4/2020 | Kellogg et al. | |
| 10,753,800 B2* | 8/2020 | Mun | G01J 3/443 |
| 10,774,423 B2* | 9/2020 | Janakiraman | C23C 16/458 |
| 2018/0102238 A1 | 4/2018 | Gu et al. | |
| 2019/0301937 A1* | 10/2019 | Mun | G01N 21/73 |
| 2020/0118796 A1* | 4/2020 | Arakelyan | H01L 21/68735 |
| 2020/0411287 A1* | 12/2020 | Gu | H01J 37/32642 |

FOREIGN PATENT DOCUMENTS

| KR | 10-2010-0129368 | 12/2010 |
| KR | 10-2011-0096691 | 8/2011 |
| KR | 10-2018-0000291 A | 1/2018 |
| KR | 2018-0038596 | 4/2018 |

\* cited by examiner

PLASMA PROCESSING APPARATUS AND METHOD OF OPERATING THE SAME

CROSS REFERENCE TO RELATED APPLICATION

The present application claims priority to Korean Patent Application No. 10-2019-0076782, filed Jun. 27, 2019, the entire contents of which is incorporated by reference herein for all purposes by this reference.

BACKGROUND OF THE INVENTION

Field of the Invention

The present invention relates to a plasma processing apparatus and a method of operating the same.

Description of the Related Art

A plasma processing apparatus for processing a substrate such as a semiconductor wafer by using plasma, such as an etching apparatus or a deposition apparatus, includes a processing chamber that provides a space for processing the substrate. Plasma can be generated in various ways, and for example, can be generated by applying high-frequency power between upper and lower electrodes provided in the processing chamber. The upper electrode may be an upper wall of the processing chamber or a shower head supplying processing gas, and the lower electrode may be a chuck member supporting the substrate. An RF power source may be connected to any one of the upper electrode and the lower electrode, and the remaining electrode may be grounded. In some cases, at least one RF power source may be connected to both electrodes. In addition to the RF power source for plasma generation, RF power sources for ion acceleration in the direction of the substrate or for ion directivity control may be connected to the lower electrode. When a plurality of RF power sources are provided, RF power of frequencies different from each other is generally output. The RF power of relatively high frequency is used for plasma generation, and the RF power of relatively low frequency is used for the ion acceleration or the ion directivity control. In addition, a variable DC power source for controlling plasma distribution may be connected to the upper electrode.

Meanwhile, a focus ring is normally disposed in the vicinity of a chuck member. The focus ring allows plasma to be focused on a substrate area, and plasma properties and the ion directivity in the center and edge area of the substrate to be uniform. However, as a plasma processing process is repeated, erosion of the focus ring due to ion bombardment progresses, which acts as a factor that changes the plasma properties and the ion directivity in the edge area. As for the plasma etching apparatus, when the ion directivity changes in the edge area, an etching pattern is not formed vertically, and a tilting phenomenon in which the apparatus is inclined by a certain angle occurs.

To solve this problem, an edge electrode may be provided in the vicinity of the chuck member to control edge impedance. The edge electrode is provided in a ring shape to surround the chuck member, and the chuck member and the edge electrode may be insulated from each other. An edge impedance controller including an impedance control circuit may be configured to be connected to the edge electrode to control the impedance. When the edge impedance is controlled, the RF power, which is transmitted to the focus ring, of RF power applied to the chuck member can be changed. Accordingly, the potential of the upper end of the focus ring is changed, so a plasma sheath in the edge area can be controlled. When such an impedance control technology is used, plasma properties and the ion directivity can be adjusted uniformly in the center and edge area of the substrate even when the focus ring is eroded.

However, in such a technology, the RF power supplied to the chuck member may be lost through the edge electrode toward the impedance control circuit of the edge impedance controller. This may lead to a decrease in efficiency in which the RF power supplied to the chuck member is not fully used for plasma generation and maintenance.

In addition, when the RF power of a plurality of frequencies rather than single frequency is connected to the chuck member, the RF power of various frequencies supplied to the chuck member is transmitted to the edge impedance controller, so that the control of the plasma sheath in the edge area through impedance control becomes difficult.

Furthermore, in a plasma processing apparatus using the edge impedance controller, an impedance control method of transmitting the RF power of an appropriate magnitude to the focus ring in a plasma environment that fluctuates in real time is required.

DOCUMENT OF RELATED ART (Patent Document 1) Korean Patent Application Publication No. 10-2018-0038596

SUMMARY OF THE INVENTION

The present invention has been made keeping in mind the above problems occurring in the related art, and the present invention is intended to propose plasma processing apparatus and method of operating the same, wherein the loss of RF power supplied to a chuck member toward an impedance control circuit of an edge impedance controller through an edge electrode can be minimized.

In addition, the present invention is intended to solve the difficulty of the control of a plasma sheath in an edge area via impedance control by transmitting the RF power of various frequencies, which is supplied to the chuck member, to the impedance control circuit of the edge impedance controller.

Furthermore, the present invention is intended to propose plasma processing apparatus and method, wherein the RF power of an appropriate magnitude can be transmitted to a focus ring by using the edge impedance controller in a plasma environment that fluctuates in real time.

According to an exemplary embodiment of the present invention, a plasma processing apparatus includes a processing chamber providing space for plasma generation, a chuck member provided in the processing chamber and supporting a substrate, at least two RF power sources providing RF power of different frequencies to the chuck member, a ring member provided to surround the chuck member, an edge electrode arranged in the ring member to be electrically insulated from the chuck member, and a variable impedance circuit being electrically connected to the edge electrode. The variable impedance circuit includes an adjustable impedance configured to control a potential of the edge electrode and a high-frequency stop circuit configured to block high-frequency power from being transmitted to the adjustable impedance.

The variable impedance circuit further includes a middle-frequency stop circuit configured to block middle-frequency power from being transmitted to the adjustable impedance.

The high-frequency stop circuit includes a high pass filter connected in parallel with the adjustable impedance.

The high-frequency stop circuit includes a low pass filter connected in series with the adjustable impedance.

The middle-frequency stop circuit includes a middle-frequency band stop filter connected in series with the adjustable impedance.

A frequency of the high-frequency power is 27 MHz or more.

The high-frequency stop circuit is further configured to allow low-frequency power of 3 MHz or less to pass toward the adjustable impedance.

The at least two RF power sources include a first RF power source, a second RF power source, and a third RF power source, the first RF power source, the second RF power source, and the third RF power source outputting the high-frequency power, middle-frequency power, and low-frequency power, respectively.

The ring member includes a first ring member provided to surround a circumference of the substrate supported by the chuck member, and a second ring member of an insulation material provided under the first ring member to surround a circumference of the chuck member. The edge electrode is inserted into the second ring member, and is insulated from the chuck member by the second ring member.

The first ring member is a focus ring.

The adjustable impedance includes a variable capacitor, the potential of the edge electrode being controlled by adjusting capacitance of the variable capacitor.

According to an exemplary embodiment of the present invention, a plasma processing apparatus includes a substrate supporting unit having a lower electrode and a ring member surrounding the lower electrode, a first RF power source electrically connected to the lower electrode and supplying first power of a first frequency to the lower electrode, a second RF power source electrically connected to the lower electrode and supplying second power of a second frequency to the lower electrode, the second frequency smaller than the first frequency, an edge electrode arranged in the ring member to be electrically insulated from the lower electrode, a variable impedance circuit electrically connected to the edge electrode, the variable impedance circuit including a first branch including a high-frequency pass filter, and a second branch, connected in parallel to the first branch, including a low-frequency pass filter, a middle-frequency band stop filter and an adjustable impedance connected in series, and the edge electrode electrically connected to a node where the first branch and the second branch are connected to each other, and a capacitor controller configured to control impedance of the adjustable impedance on the basis of an amount of current flowing through the adjustable impedance or a voltage applied to the adjustable impedance.

The first frequency of the first RF power source is at least 27 MHz.

The second frequency of the second RF power source is up to 3 MHz.

The apparatus further includes a sensor configured to measure the amount of current or the voltage.

The adjustable impedance includes a variable capacitor.

Capacitance of the variable capacitor is adjusted by the capacitor controller based on the amount of current or the voltage.

A potential of the edge electrode is controlled by adjusting capacitance of the variable capacitor.

According to an exemplary embodiment of the present invention, a plasma processing method of processing a substrate includes applying high-frequency power and low-frequency power to a lower electrode, blocking the high-frequency power flowing into an adjustable impedance by using a high-frequency stop circuit, measuring a low-frequency voltage applied to or an amount of current flowing into the adjustable impedance, and controlling impedance of the adjustable impedance on the basis of the measured low-frequency voltage or amount of current.

BRIEF DESCRIPTION OF THE DRAWINGS

The above and other objects, features, and other advantages of the present invention will be more clearly understood from the following detailed description when taken in conjunction with the accompanying drawings, in which.

DETAILED DESCRIPTION OF THE INVENTION

Hereinbelow, the present invention will be described in detail with reference to the accompanying drawings. The following description includes a specific embodiment, but the present invention is not limited to the described embodiment. In the description of the present invention, when it is determined that a detailed description of related known technologies may obscure the subject matter of the present invention, the detailed description will be omitted.

Figure 1:
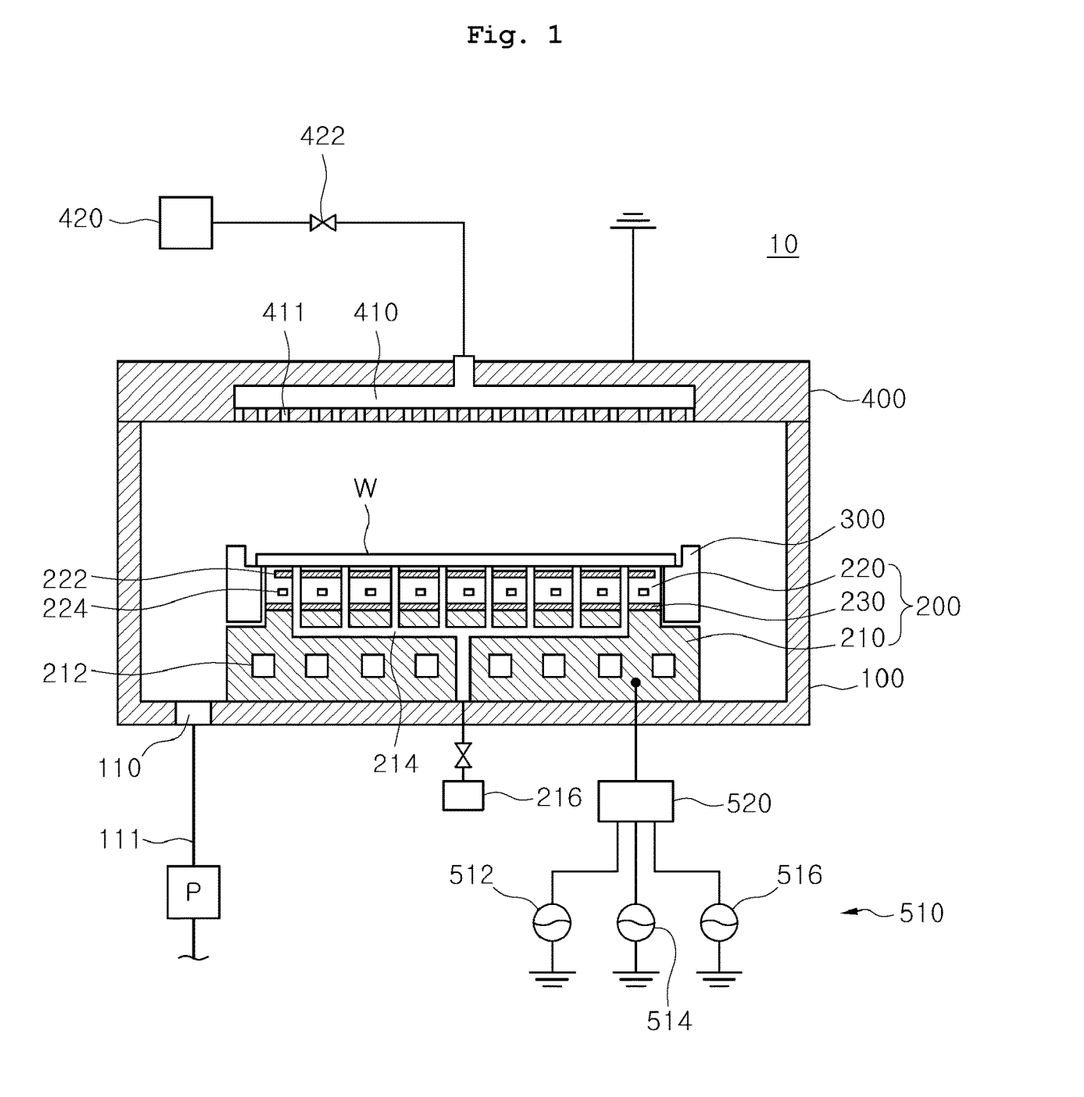
FIG. 1 is a view illustrating the configuration of a plasma processing apparatus according to an embodiment of the present invention.

FIG. 1 is a view illustrating the configuration of a plasma processing apparatus according to an embodiment of the present invention.

Referring to FIG. 1, the plasma processing apparatus 10 includes a processing chamber 100, a chuck member 200, a ring member 300, and a gas discharge unit 400.

The processing chamber 100 provides an inner space for performing a substrate processing process by generating plasma. The substrate processing process can be performed in a vacuum atmosphere. To this end, an exhaust port 110 is provided in the processing chamber 100. A vacuum pump P is connected to the exhaust port 110 by an exhaust line 111.

The gas discharge unit 400 is configured to discharge processing gas for processing a substrate, and includes a diffusion chamber 410 connected to a process gas source 420 and a plurality of discharge holes 411. The plurality of discharge holes 411 are provided in a surface facing the substrate W, and the processing gas supplied to the diffusion chamber 410 from the process gas source 420 is discharged to the upper surface of the substrate W through the discharge holes 411. The processing gas supply valve 422 controls the flow rate of the processing gas supplied to the gas discharge unit 400. In FIG. 1, the gas discharge unit is described to have the shape of a shower head, but the present invention is not limited thereto. For example, the processing gas may be supplied into the processing chamber 100 through a gas injection nozzle provided on a sidewall of the processing chamber 100.

The chuck member 200 is provided inside the processing chamber 100 to support the substrate W. The chuck member 200 may be configured by including an electrostatic chuck 220 adhering to and fixing the substrate W thereto, and a base plate 210 supporting the electrostatic chuck 220. The electrostatic chuck 220 and the base plate 210 may be bonded to each other by a bonding layer 230, and the bonding layer 230 may be formed of silicon or the like.

The electrostatic chuck 220 may be configured as a dielectric plate made of alumina, and a chuck electrode 222 may be provided therein to generate an electrostatic force. When a voltage is applied to the chuck electrode 222 by a power source, which is not shown, the electrostatic force is generated, and the substrate W is adhered to and fixed to the electrostatic chuck 220. The electrostatic chuck 220 may be provided with heaters 224 for heating the substrate W to a predetermined temperature.

The base plate 210 is located under the electrostatic chuck 220, and may be made of a metal material such as aluminum. The base plate 210 includes refrigerant flow paths 212 provided therein through which a cooling fluid flows, and can perform the function of a cooling means cooling the electrostatic chuck 220. The refrigerant flow paths 212 may be provided as circulation paths through which the cooling fluid circulates.

In addition, a heat transfer gas flow path 214 is provided in the chuck member 200, and provides heat transfer gas such as helium (He) from a heat transfer gas supply source 216 to the rear surface of the substrate. The heat transfer gas can facilitate heat transfer between the base plate 210 and the substrate W to promote cooling of the substrate W.

A plasma source for plasma generation is provided in the plasma processing apparatus 10. Plasma can be generated in various methods. For example, an inductively coupled plasma (ICP) method, a capacitively coupled plasma (CCP) method, or a remote plasma method may be used. In a capacitively coupled plasma (CCP) apparatus of the FIG. 1, for example, an RF power source 510 for generating a potential difference may be provided between an upper electrode and a lower electrode. In the configuration of the apparatus of FIG. 1, the gas discharge unit 400 may act as the upper electrode, and the chuck member 200 may act as the lower electrode. That is, the gas discharge unit 400 corresponding to the upper electrode is grounded, and the RF power source 510 may be electrically connected to the base plate 210 of the chuck member 200 corresponding to the lower electrode. A matching unit 520 may be provided between the base plate 210 and the RF power source 510.

The RF power source 510 may include a first RF power source 512, a second RF power source 514, and a third RF power source 516. Each of the first RF power source 512, the second RF power source 514, and the third RF power source 516 can output the RF power of different frequency. For example, the first RF power source 512 can output the RF power of a first frequency band; the second RF power source 514 can output the RF power of a second frequency band; and the third RF power source 516 can output the RF power of a third frequency band. The first frequency band may be high frequency power of about 60 MHz or more; the second frequency band may be the middle frequency power of about 10 MHz; and the third frequency band may be the low frequency power of about 2 MHz or less. In some cases, the second RF power source 514 outputting the middle frequency power may be omitted. The high frequency power and the middle frequency power supplied by the first RF power source 512 and the second RF power source 514, respectively, can mainly contribute to the generation of plasma, and the power of relatively low frequency supplied by the third RF power source 516 can contribute to the directivity and acceleration properties of ion introduced to the substrate W.

The matching unit 520 is a device for matching the impedance of the RF power source 510 with the impedance of a load side, and may include a plurality of matching circuits to correspond to the first RF power source 512, the second RF power source 514, and the third RF power source 516, respectively.

The ring member 300 is provided in the vicinity of the chuck member 200. The chuck member 200 and the ring member 300 together constitute a substrate supporting unit. The ring member 300 may serve to concentrate plasma to an area in which the substrate W is located, and to uniformly distribute plasma density in the entire area of the substrate W. Accordingly, a substrate processing efficiency is improved, and uniform processing can be performed in the center and edge area of the substrate W.

Figure 2:
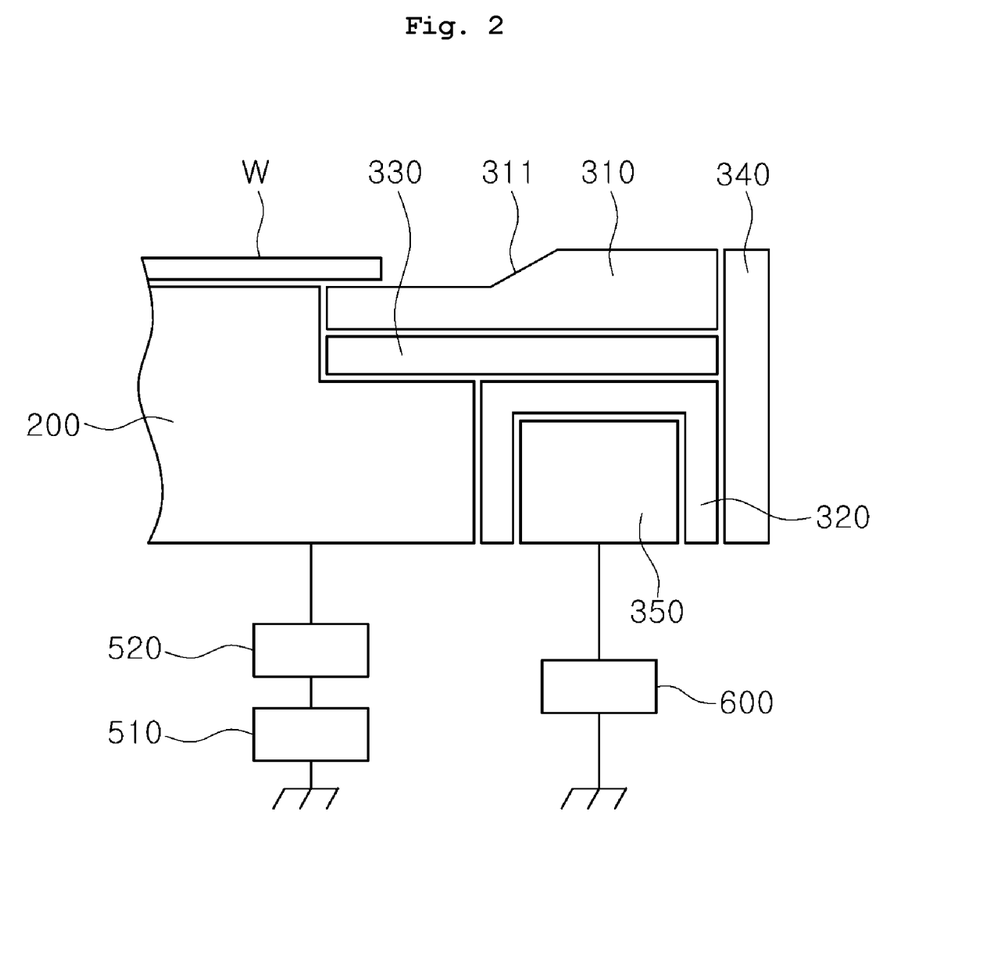
FIG. 2 is a view illustrating a portion of a substrate supporting unit of the plasma processing apparatus according to the embodiment of the present invention.

FIG. 2 is a view illustrating a portion of the substrate supporting unit of the plasma processing apparatus according to the embodiment of the present invention. The configuration of the substrate supporting unit will be described in further detail referring to FIG. 2.

As illustrated in FIG. 2, the substrate supporting unit according to the embodiment of the present invention may be composed of the chuck member 200 and the ring member 300 surrounding the circumference of the chuck member 200. The ring member 300 may include a first ring member 310, a second ring member 320, a third ring member 330, and a fourth ring member 340. For the simplicity of drawings, constituent elements of FIG. 2 may be drawn to be spaced apart from each other. In an exemplary embodiment, each of the constituent elements may be in contact with its adjacent elements. For example, the first ring member 310 may be in contact with the chuck member 200, the third ring member 330 and the fourth ring member 340.

The first ring member 310 is arranged so that the upper surface thereof is almost identical to the upper surface of the chuck member 200, and has a step 311 formed in the width direction thereof. Accordingly, the first ring member 310 may be provided to surround the circumference of the substrate adhering to the chuck member 200. The first ring member 310 may be a focus ring. The focus ring allows ions generated during a plasma process to concentrate on the substrate. The first ring member 310 may be formed of materials such as silicon (Si), silicon carbide (SiC), and quartz, etc. The material and structure of the first ring member 310 may be changed depending on the plasma processing apparatus.

The second ring member 320 may be provided under the first ring member 310 to surround the circumference of the chuck member 200. The second ring member 320 may be made of an insulating material. The second ring member 320 separates the chuck member 200 from the outer wall of the processing chamber 100, and can electrically insulate the first ring member 310 from modules under the chuck member 200.

The third ring member 330 of metal may be provided between the first ring member 310 and the chuck member 200 and between the first ring member 310 and the second ring member 320. In an exemplary embodiment, the third ring member 330 may be omitted, and the first ring member 310 may be adjacent to the second ring member 320. The third ring member 330 may extend to the upper surface of the second ring member 320. In addition, the fourth ring member 340 of an insulating material may be provided to surround the outer circumferential surface of the first ring member 310. The fourth ring member 340 may extend in a downward direction to cover the side surface of the second ring member 320.

In the present invention, the configuration of the ring member 300 is not limited to the configuration illustrated in FIG. 2, and can be variously modified. For example, the second ring member 320 and the fourth ring member 340 may be provided in one undivided configuration.

The ring member 300 may further include an edge electrode 350 that is electrically insulated from the chuck member 200. Specifically, the edge electrode 350 may be inserted into the second ring member 320. That is, the edge electrode 350 is arranged in the vicinity of the chuck member 200 to be insulated from the chuck member 200, the first ring member 310, and the third ring member 330. Such insulation can be provided by the second ring member 320. The edge electrode 350 may have a ring shape or be made of a conductive material. For example, the edge electrode 350 may be provided as a metal ring.

The edge electrode 350 may be electrically connected to an edge impedance controller 600. The edge impedance controller 600 may be also referred to as a variable impedance circuit. The edge impedance controller 600 can control the plasma sheath and directionality of ions in the edge area by adjusting the potential of the edge electrode 350 by using an impedance control circuit provided in the edge impedance controller 600. For example, the shape of the plasma sheath on the edge area controlled by the adjusted potential of the edge electrode 350 may control a moving direction of an ion entering the plasma sheath from a glow region of the plasma generated in the chamber. Accordingly, uniform plasma processing can be performed to the edge area of the substrate W. The impedance control circuit may be configured by including a variable capacitor.

Particularly, the control of using the edge electrode 350 and the edge impedance controller 600 can be effectively applied even when the first ring member 310 is worn due to repeated exposure to plasma. This will be described with reference to FIGS. 3A, 3B, 3C, and 3D. FIGS. 3A, 3B, 3C, and 3D partially illustrate only the chuck member 200, the substrate W, and the first ring member 310.

Figure 3A:
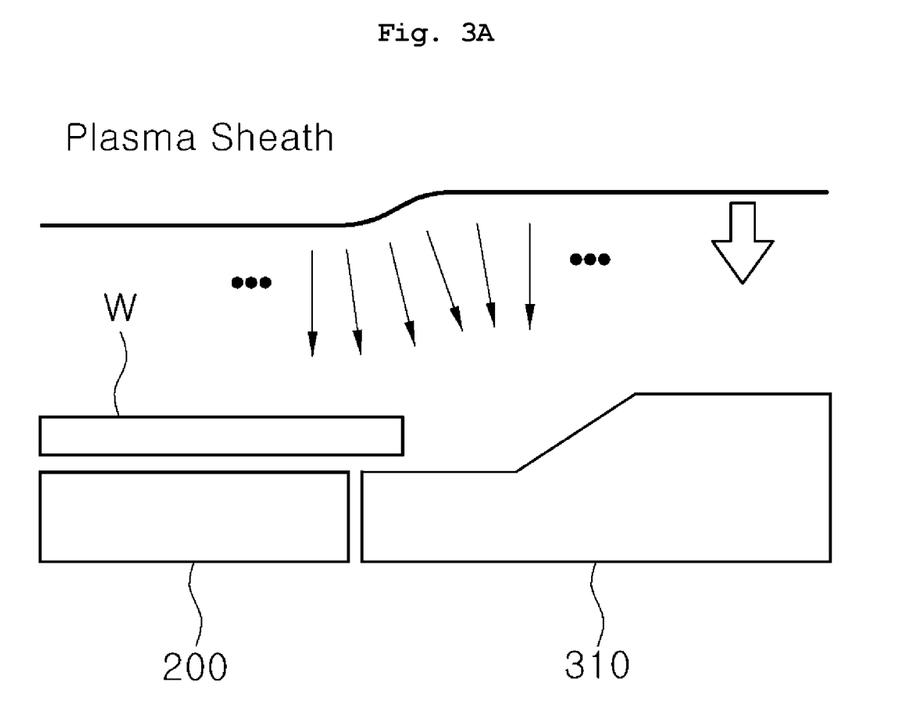
FIGS. 3A, 3B, 3C, and 3D are views illustrating the control of a plasma sheath in an edge area.
Figure 3B:
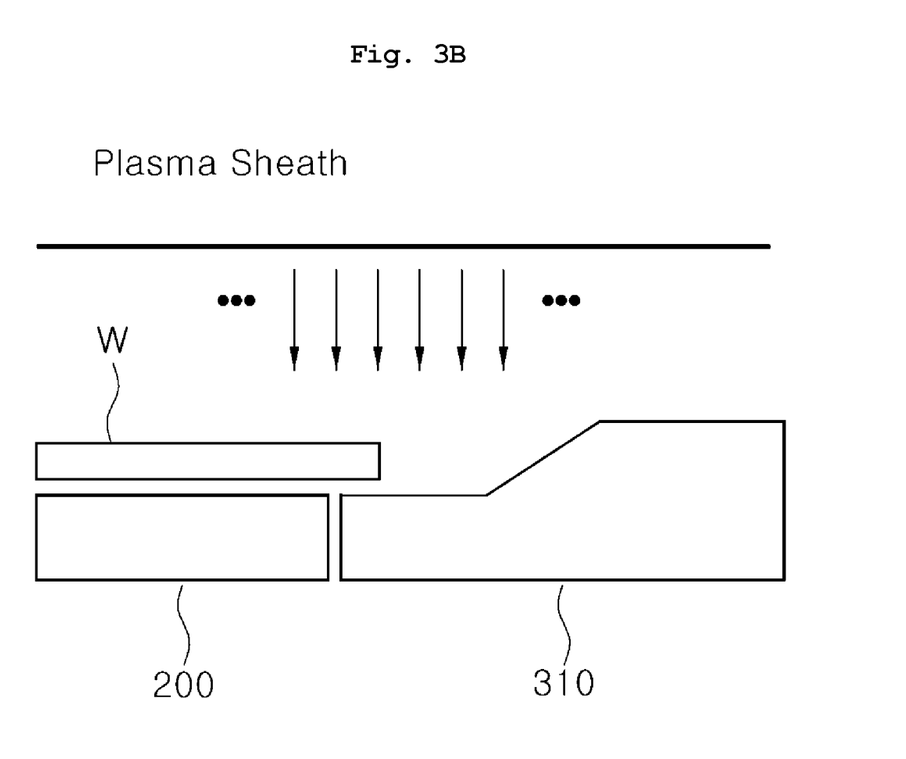
Figure 3C:
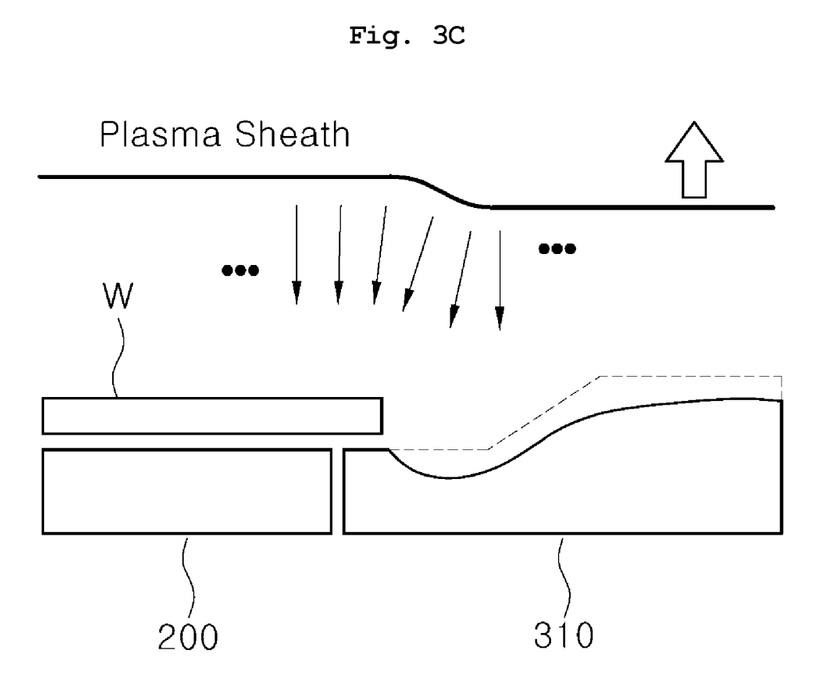
Figure 3D:
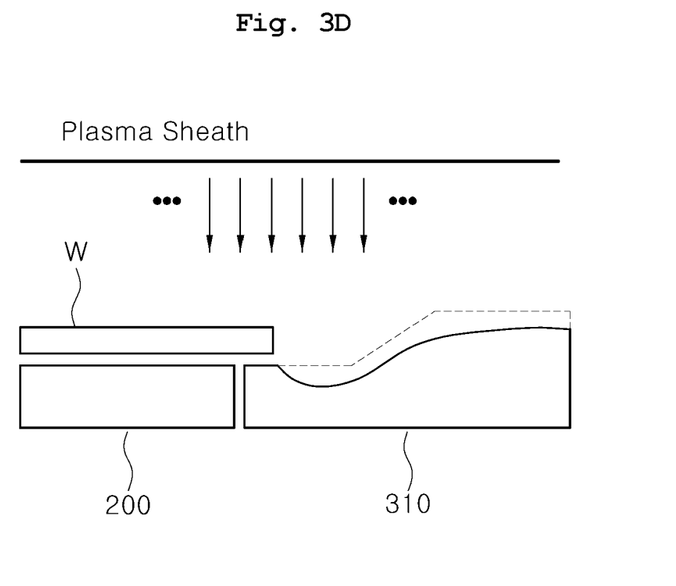

Referring to FIG. 3A, the position of the plasma sheath in the edge area of the substrate is not uniform, and the directivity of ions accelerated through the plasma sheath is not also constant. In this state, as illustrated in FIG. 3B, the position of the plasma sheath can become uniform and the ion directivity can also become perpendicular to the substrate through the adjustment by the edge impedance controller 600. Meanwhile, when the first ring member 310 wears, the position of the plasma sheath and the ion directivity may be again in a state in which adjustment is required as illustrated in FIG. 3C. In this case, the position of the plasma sheath of the edge area is adjusted to rise by using the edge impedance controller 600. Accordingly, as illustrated in FIG. 3D, even if the first ring member 310 is worn, the position of the plasma sheath and the ion directivity can be adjusted uniformly again.

Figure 4:
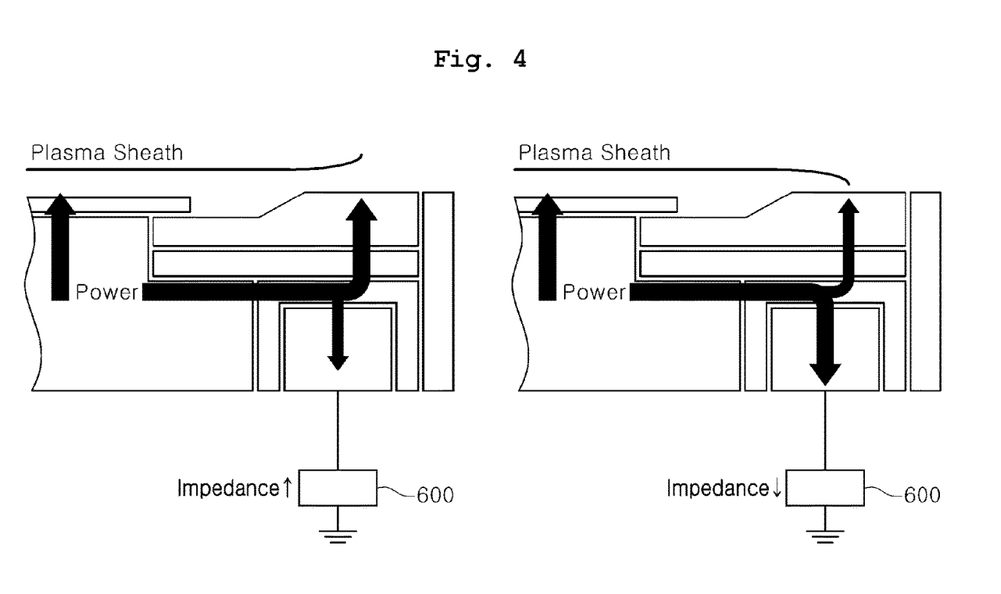
FIG. 4 is a view illustrating a principle in which the position of the plasma sheath is controlled in the edge area of a substrate by edge impedance control.

FIG. 4 is a view illustrating a principle in which the position of the plasma sheath is controlled in the edge area of a substrate by edge impedance control. When the edge impedance controller 600 connected to the edge electrode 350 controls the impedance in the direction of increasing the impedance, the RF power applied to the chuck member 200 is transmitted to the first ring member 310 in an amount more than to the edge electrode 350. Accordingly, a potential upside the first ring member 310 is increased and the plasma sheath is adjusted in the direction of getting away from the first ring member 310. On the other hand, when the edge impedance controller 600 controls the impedance in the direction of decreasing the impedance, the amount of the RF power in which the RF power applied to the chuck member 200 is transmitted to the edge electrode 350 is increased. Accordingly, the potential upside the first ring member 310 is decreased, and the plasma sheath is adjusted in the direction of getting closer to the first ring member 310. Accordingly, the amount of the RF power in which the RF power applied to the chuck member 200 is transmitted to the first ring member 310 is controlled, and the potential of the upper end of the first ring member 310 is changed, whereby the control of the plasma sheath is possible. Particularly, the edge impedance controller 600 is not connected directly to the first ring member 310, but is connected to the edge electrode 350 insulated from the first ring member 310 to control edge impedance. Accordingly, a central area other than the edge area (an extreme edge area) of about 3 mm or less, which is extremely narrow, in an end part of the substrate W may not be affected.

Accordingly, in the control method of using the edge impedance controller 600, the amount of the RF power in which the RF power applied to the chuck member 200 is transmitted to the first ring member 310 is controlled to change the potential of the upper end of the first ring member 310. Accordingly, in the control process, the leakage of the RF power to the edge impedance controller 600 may occur through the edge electrode 350. To minimize such RF power leakage, a plasma processing apparatus according to the embodiment of the present invention allows the RF power, which is relatively high frequency, of the RF power supplied to the chuck member 200 to be blocked and only the RF power thereof, which is relatively low frequency, to be transmitted in the direction of the impedance control circuit of the edge impedance controller 600. That is, the edge impedance controller 600 controls impedance while high frequency power is blocked, and controls the plasma sheath of the edge area by using only the low frequency power of the RF power supplied to the chuck member 200. Due to such a method, the RF power of relatively high frequency, which contributes to plasma generation, of the RF power supplied to the chuck member 200, is not leaked toward the edge impedance controller 600, but is transmitted to plasma, so plasma generation efficiency can be increased.

Figure 5:
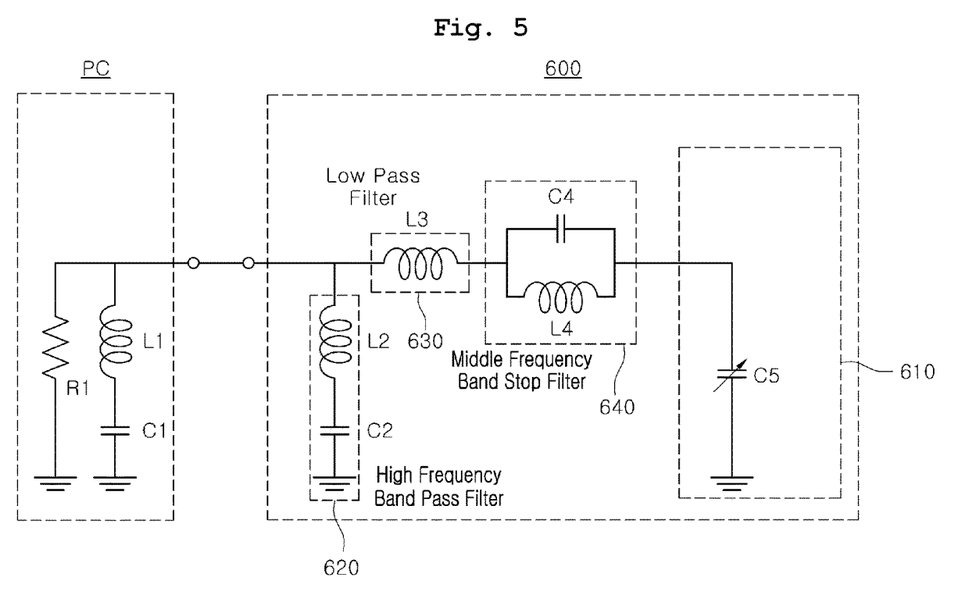
FIG. 5 is the equivalent circuit of a plasma processing apparatus according to the embodiment of the present invention.

Specifically, the method of having a high-frequency stop circuit provided in the edge impedance controller 600 may be used. FIG. 5 is the equivalent circuit of the edge impedance controller 600 according to the embodiment of the present invention. In FIG. 5, a process chamber (PC) is a part of excluding the edge impedance controller 600 from the plasma processing apparatus 10. That is, it is required to be understood that the process chamber includes the processing chamber 100, the chuck member 200, the ring member 300, the gas discharge unit 400, the RF power source 510, the matching unit 520, and plasma generated inside the processing chamber 100. As illustrated in FIG. 5, the part of the process chamber (PC) may be represented as an equivalent circuit consisting of a resistor R1, a capacitor C1, and an inductor L1.

The edge impedance controller 600 includes the impedance control circuit 610 and the high-frequency stop circuit 620 and 630, and may further include a middle frequency stop circuit 640 selectively.

The impedance control circuit 610 may be configured by including the variable capacitor C5. The impedance control circuit 610 changes capacitance by controlling the variable capacitor C5 so that the impedance can be changed. In this case, the variable capacitor C5 may be controlled in the direction in which the plasma sheath upside the first ring member 310 is flattened.

The high-frequency stop circuit 620 and 630 allows the relatively high frequency power of the RF power applied to the chuck member 200 to be blocked, and only relatively low frequency power thereof to pass. For example, the high-frequency stop circuit may be a circuit that allows the power of the first frequency band supplied by the first RF power source 512 of FIG. 1 to be blocked, and the power of the third frequency band supplied by the third RF power source 516 to pass.

The high-frequency stop circuit may be configured by including a high pass filter 620 connected in parallel with the impedance control circuit 610 and a low pass filter 630 connected in series with the impedance control circuit 610. When the high pass filter 620 is connected in parallel with the impedance control circuit 610, the high frequency power can be blocked from flowing in the direction of the impedance control circuit 610. In this case, the impedance of the high pass filter is required to be lower than the impedance of the impedance control circuit 610 for the high frequency power to be blocked. Accordingly, when the high pass filter is configured as a circuit including a capacitor C2 and the inductor L2, values of C2 and L2 can be designed such that the impedance of the high pass filter is lower than the impedance of the impedance control circuit 610. The high pass filter 620 may be designed to block the high frequency of about 27 MHz or higher.

The low pass filter 630 is a part that allows only the low frequency power of the RF power applied to the chuck member 200 to pass toward the impedance control circuit 610, and may be configured by including the inductor L3. The low pass filter 630, together with the high pass filter 620, more completely blocks the high frequency power, and allows the low frequency power required for the control of the plasma sheath to pass in the direction of the impedance control circuit 610. By allowing the low frequency power to pass, the magnitude of the low frequency power transmitted to the first ring member 310 is changed by the impedance control of the impedance control circuit 610, so that the position of the plasma sheath upside the first ring member 310 can be controlled (see FIG. 4). The low pass filter 630 may be designed to allow only the low frequency of about 3 MHz or less to pass.

The high-frequency stop circuit 620 and 630 of FIG. 5 is for an illustrative purpose, and various types of high-frequency stop filter circuits may be configured by being connected in series or in parallel with the impedance control circuit 610.

The middle frequency stop circuit 640, which may be selectively provided, is a part that blocks the middle frequency power of the RF power applied to the chuck member 200. For example, the middle frequency stop circuit 640 may be a circuit that blocks the power of the second frequency band such that the power of the second frequency band supplied by the second RF power source 514 of FIG. 1 is not transmitted to the impedance control circuit 610. Due to the blocking of the middle frequency power, the middle frequency power applied to the chuck member 200 can be used to generate plasma without loss. The middle frequency stop circuit 640 may be configured as a band stop filter connected in series with the impedance control circuit 610, but is not limited thereto. The middle frequency stop circuit 640 may be designed to block frequencies in the range of about 1 MHz to 27 MHz.

In the plasma processing apparatus according to the embodiment of the present invention, the high frequency power and/or the middle frequency power applied to the chuck member 200 is blocked from leaking toward the impedance control circuit 610 of the edge impedance controller 600, so plasma generation efficiency is increased. In addition, the high frequency power and/or the middle frequency power is not allowed to be transmitted to the impedance control circuit 610 of the edge impedance controller 600, so the control of the plasma sheath of the edge area via the impedance control can be easily performed by using only the low frequency power without interruption.

Figure 6:
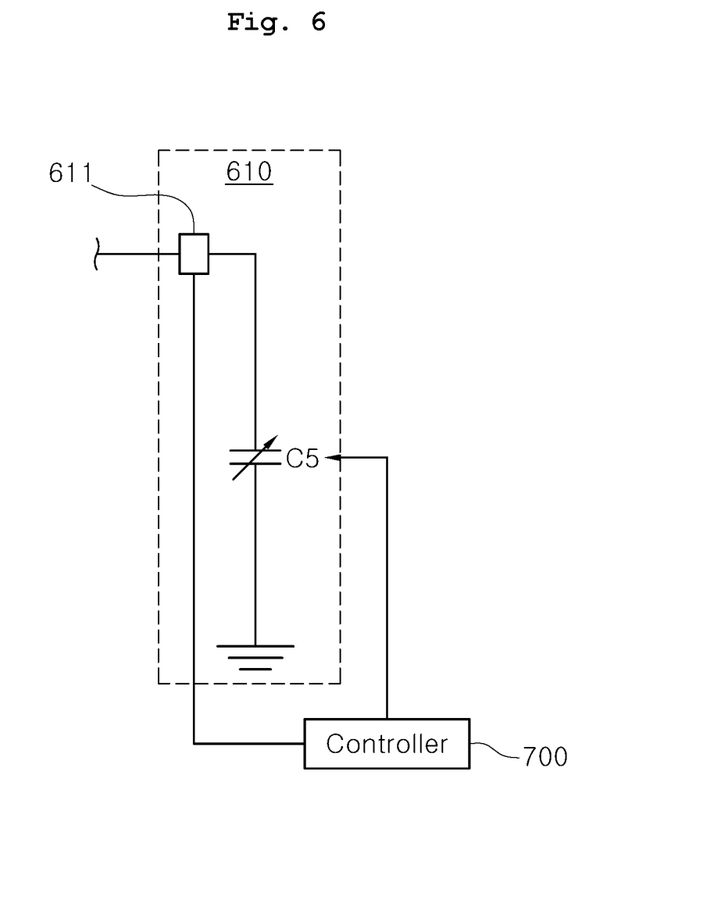
FIG. 6 and FIG. 7 are views illustrating the configuration of an impedance control circuit of an edge impedance controller and the control method of the same, respectively, according to the embodiment of the present invention.
Figure 7:
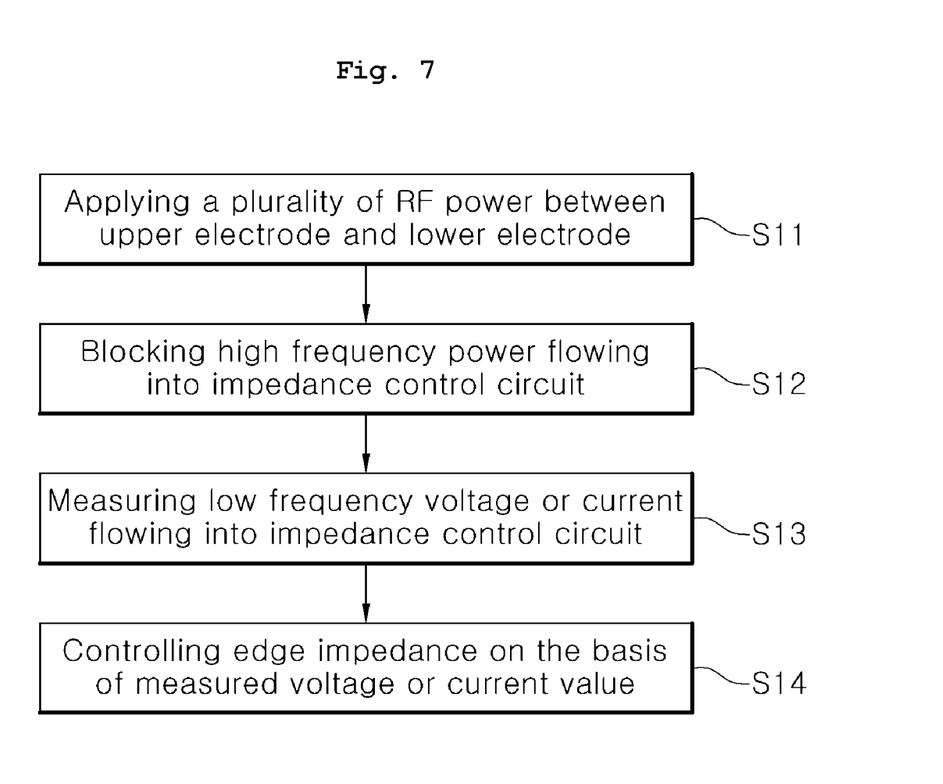

FIGS. 6 and 7 are views illustrating the configuration and the control method of the impedance control circuit 610 of the edge impedance controller 600 according to the embodiment of the present invention.

Referring to FIG. 6, the impedance control circuit 610 includes the variable capacitor C5 provided therein and a sensor 611 provided at the front end thereof. The sensor 611 can measure the low frequency voltage or current flowing into the impedance control circuit 610. The measured result of the sensor 611 is transmitted to a capacitor controller 700, and the capacitor controller 700 can adjust the variable capacitor C5 to an appropriate value on the basis of the measured result. In an exemplary embodiment, the sensor 611 may be a current meter or voltage meter. The sensor 611 may measure the low frequency voltage applied to the variable capacitor C5 or an amount of current flowing into the variable capacitor C5.

Referring to FIG. 7, the plasma processing method according to the embodiment of the present invention may include: applying a plurality of RF power between the upper electrode and the lower electrode at S11; blocking the high frequency power flowing into the impedance control circuit at S12; measuring the low frequency voltage or current flowing into the impedance control circuit at S13; and controlling the edge impedance on the basis of the measured voltage or current value at S14.

At S11, plasma is generated in the processing chamber, and the RF power may be applied to the chuck member 200 functioning as the lower electrode by using the RF power source 500. In this case, the RF power source 500 may include the first RF power source 512, the second RF power source 514, and the third RF power source 516. The first RF power source 512 may output the high frequency power, the second RF power source 514 may output the RF power of middle frequency band, and the third RF power source 516 may output the low frequency power. The second RF power source 514 may be omitted.

At S12, the high frequency power flowing into the impedance control circuit 610 is blocked by the high-frequency stop circuit 620 and 630 provided in the edge impedance controller 600. At S12, the middle frequency power can also be blocked. To this end, the edge impedance controller 600 may further include the middle frequency stop circuit 640.

At S13, the low frequency voltage or current flowing into the impedance control circuit 610 is measured by the sensor 611. The measured voltage or current is transmitted to the capacitor controller 700, and can be used to adjust the variable capacitor C5 of the impedance control circuit 610 at S14.

In the plasma processing method according to the embodiment of the present invention, the sensor capable of measuring current and voltage flowing into the edge impedance controller is provided, whereby the feedback control of impedance is performed, so that the RF power of an appropriate magnitude can be transmitted to the focus ring in real time.

Although the exemplary embodiment of the present invention has been described for illustrative purposes, those skilled in the art will appreciate that various modifications, additions and substitutions are possible, without departing from the scope and spirit of the invention as disclosed in the accompanying claims. Therefore, the protection scope of the present invention should be defined by the description of the claims and their equivalents.

What is claimed is:

1. A plasma processing apparatus comprising:
   a processing chamber providing space for plasma generation;
   a chuck member provided in the processing chamber and supporting a substrate;
   at least two RF power sources providing RF powers of different frequencies to the chuck member, wherein the RF powers include high-frequency power of a first frequency and low-frequency power of a second frequency smaller than the first frequency;
   a ring member provided to surround the chuck member;
   an edge electrode arranged in the ring member to be electrically insulated from the chuck member; and
   a variable impedance circuit being electrically connected to the edge electrode,
   wherein the variable impedance circuit includes:
      an adjustable impedance configured to control a potential of the edge electrode; and
      a high-frequency stop circuit configured to block the high-frequency power from being transmitted to the adjustable impedance.

2. The apparatus of claim 1,
   wherein the RF powers further include middle-frequency power of a third frequency between the first frequency and the second frequency, and
   wherein the variable impedance circuit further comprises:
   a middle-frequency stop circuit configured to block the middle-frequency power from being transmitted to the adjustable impedance.

3. The apparatus of claim 1,
   wherein the high-frequency stop circuit comprises a high pass filter connected in parallel with the adjustable impedance.

4. The apparatus of claim 1,
   wherein the high-frequency stop circuit comprises a low pass filter connected in series with the adjustable impedance.

5. The apparatus of claim 2,
   wherein the middle-frequency stop circuit comprises a middle-frequency band stop filter connected in series with the adjustable impedance.

6. The apparatus of claim 1,
   wherein the first frequency of the high-frequency power is 27 MHz or more.

7. The apparatus of claim 1,
   wherein the high-frequency stop circuit is further configured to allow the low-frequency power of 3 MHz or less to pass toward the adjustable impedance.

8. The apparatus of claim 1,
   wherein the at least two RF power sources comprise a first RF power source, a second RF power source, and a third RF power source, the first RF power source, the second RF power source, and the third RF power source outputting the high-frequency power, middle-frequency power, and the low-frequency power, respectively.

9. The apparatus of claim 1,
   wherein the ring member comprises:
      a first ring member provided to surround a circumference of the substrate supported by the chuck member, and
      a second ring member of an insulation material provided under the first ring member to surround a circumference of the chuck member, and
   wherein the edge electrode is inserted into the second ring member, and is insulated from the chuck member by the second ring member.

10. The apparatus of claim 9,
    wherein the first ring member is a focus ring.

11. The apparatus of claim 1,
    wherein the adjustable impedance comprises a variable capacitor, the potential of the edge electrode being controlled by adjusting capacitance of the variable capacitor.

12. The apparatus of claim 1, further comprising:
    a sensor measuring an electric current or voltage flowing into the adjustable impedance, and
    a capacitor controller controlling capacitance of the adjustable impedance on the basis of the measured value of the sensor.

13. A plasma processing apparatus comprising:
    a substrate supporting unit having a lower electrode and a ring member surrounding the lower electrode;
    a first RF power source electrically connected to the lower electrode and supplying high-frequency power of a first frequency to the lower electrode;
    a second RF power source electrically connected to the lower electrode and supplying low-frequency power of a second frequency to the lower electrode, the second frequency smaller than the first frequency;
    an edge electrode arranged in the ring member to be electrically insulated from the lower electrode;
    a variable impedance circuit electrically connected to the edge electrode,
    wherein the variable impedance circuit includes:
       a first branch including a high-frequency pass filter; and
       a second branch, connected in parallel to the first branch, including a low-frequency pass filter, a middle-frequency band stop filter and an adjustable impedance connected in series,
    wherein the high-frequency pass filter configured to pass the high-frequency power to a ground to block the high-frequency power from being transmitted to the adjustable impedance,
    wherein the middle-frequency band stop filter is configured to block middle-frequency power of a third frequency from being transmitted to the adjustable impedance, the third frequency between the first frequency and the second frequency,
    wherein the low-frequency pass filter is configured to pass the low-frequency power to the adjustable impedance, and
    wherein the edge electrode is electrically connected to a node wherein the first branch and the second branch are connected to each other; and a capacitor controller configured to control impedance of the adjustable impedance on the basis of an amount of current flowing through the adjustable impedance or a voltage value applied to the adjustable impedance.

14. The apparatus of claim 13, wherein the first frequency of the first RF power source is at least 27 MHz.

15. The apparatus of claim 13, wherein the second frequency of the second RF power source is up to 3 MHz.

16. The apparatus of claim 13, further comprising:
a sensor configured to measure the amount of current flowing through the adjustable impedance or the voltage value applied to the adjustable impedance.

17. The apparatus of claim 16, wherein the adjustable impedance comprises a variable capacitor.

18. The apparatus of claim 17, wherein capacitance of the variable capacitor is adjusted by the capacitor controller based on the amount of current.

19. The apparatus of claim 17, wherein a potential of the edge electrode is controlled by adjusting capacitance of the variable capacitor.

20. A plasma processing method of processing a substrate in a plasma processing apparatus comprising: an upper electrode; a substrate supporting unit having a lower electrode electrically connected to at least a high-frequency power source supplying high-frequency power of a first frequency and a low-frequency power source supplying low-frequency power of a second frequency smaller than the first frequency, and a ring member surrounding the lower electrode; a variable impedance circuit electrically connected to an edge electrode arranged in the ring member and having an adjustable impedance that controls a potential of the edge electrode; and a high-frequency stop circuit provided in the variable impedance circuit and blocking the high-frequency power such that the high-frequency power is not transmitted to the adjustable impedance, the plasma processing method comprising:
applying the high-frequency power and the low-frequency power to the lower electrode;
blocking the high-frequency power from flowing into the adjustable impedance by using the high-frequency stop circuit;
measuring a low-frequency voltage applied to or an amount of current flowing into the adjustable impedance; and
controlling impedance of the adjustable impedance on the basis of the measured low-frequency voltage or amount of current.

\* \* \* \* \*